United States Patent [19]

Milkovic

[11] Patent Number: 4,485,343

[45] Date of Patent: Nov. 27, 1984

[54] ELECTRONIC WATT AND WATTHOUR METER HAVING ANALOG AND DIGITAL OUTPUTS WITH AUTOMATIC ERROR CORRECTION

[75] Inventor: Miran Milkovic, Scotia, N.Y.

[73] Assignee: General Electric Company, Somersworth, N.H.

[21] Appl. No.: 330,660

[22] Filed: Dec. 14, 1981

[51] Int. Cl.³ .................... G01R 21/06; G01R 1/02
[52] U.S. Cl. .................. 324/142; 324/107; 324/130
[58] Field of Search .......... 324/142, 130, 107; 364/483

[56] References Cited

U.S. PATENT DOCUMENTS 3,889,225  6/1975  Pettersen .................. 324/130
4,224,671  9/1980  Sugiyama et al. ........... 324/142

Primary Examiner—Ernest F. Karlsen
Attorney, Agent, or Firm—Robert E. Brunson

[57] ABSTRACT

An improved solid state semiconductor electronic combined watthour and watt meter circuit providing both analog and digital outputs and having automatic error correction comprising first and second input transformers for developing first and second signals proportional respectively to the voltage and current being supplied from a source of electrical energy to a consumer. The first and second signals are supplied to a multiplier circuit for developing pulse-width-modulated and amplitude modulated product output signals representative of instantaneous watts. This product signal is supplied to a summing analog-to-pulse rate circuit for developing an output pulse train wherein each output pulse represents a predetermined quantized amount of energy and which is used to reverse polarity of the multiplier switches to accomplish automatic error correction. Additional polarity reversing switches are included in the multiplier switching circuits for developing a second analog output signal representative of the total watts being consumed at a given time.

10 Claims, 5 Drawing Figures

ELECTRONIC WATT AND WATTHOUR METER HAVING ANALOG AND DIGITAL OUTPUTS WITH AUTOMATIC ERROR CORRECTION

TECHNICAL FIELD

This invention relates to a new and improved electronic watt and watthour meter capable of fabrication in solid state semiconductor integrated circuit form and providing both analog and digital outputs together with automatic offset error correction of offset voltages and currents of operational amplifiers employed in the circuit.

BACKGROUND PROBLEM

In U.S. Pat. No. 3,955,138—issued May 14, 1976 for a—"Electronic Energy Consumption Meter With Input Transformer Having Single Resistance Terminated Secondary Winding Coupled To CMOS Switches Driven By Pulse Width Modulated Control Signals'—'—Miran Milkovic, inventor and assigned to the General Electric Company, an electronic watthour meter with automatic error correction and providing a digital display of kilowatt hours of energy consumed, is disclosed. Similar instruments also are described in U.S. Pat. Nos. 4,056,775 and 4,058,768 for poly-phase applications and in U.S. Pat. No. 4,056,775, all in the name of Miran Milkovic, inventor and assigned to the General Electric Company, and in a publication entitled "A Polyphase Microelectronic Watt-Hour Meter" by Miran Mildovic, published in the International Journal of Electronics, 1980, Vol. 48, No 3, pages 257-269. While these known circuits are satisfactory for their intended purpose, in addition to the digital output reading, many utility companies require an output analog signal proportional to watts of energy for use in the demand metering of electric energy supplied to consumers and for billing. The present invention makes available improved circuitry for providing both an analog signal proportional to watts in addition to the kilowatt hour digital reading obtained from an electronic meter circuit having automatic error correction.

SUMMARY OF INVENTION

It is therefore a primary purpose of the present invention to provide a new and improved electronic watt and watthour meter capable of fabrication in solid state semiconductor integrated circuit form and providing both analog and digital outputs in a circuit configuration which also provides automatic offset error correction of offset voltages and currents of operational amplifiers employed in the circuit.

In practicing the invention, an improved solid state electronic combined watthour and watt meter having analog and digital outputs together with automatic error correction is provided. The improved circuit comprises a first transformer having a primary winding connected to a source of electric energy for excitation in response to either the electric current or the electric voltage supplied from the source of electric energy and a secondary winding for providing a first signal proportional thereto. A second transformer is provided having a primary winding connected for excitation in response to the other of the electric current or electric voltage supplied from the source of electric energy and includes a secondary winding for providing a second signal proportional thereto. Multiplier circuit means are provided for receiving and multiplying the first and second signals together and deriving an output product signal representative of instantaneous power in watts being supplied by the source of electric energy. The multiplier circuit means comprises comparator circuit means for receiving the first signal and a sampling signal from a sampling signal source and deriving a pulse width modulated switching signal and multiplier switching circuit means responsive to and controlled by the pulse width modulated switching signal and having the second signal supplied to an input thereof for supplying at its output a pulse width modulated and amplitude modulated product signal of the first and second signals and representative of the instantaneous power in watts being supplied by the source of electric energy. An analog-to-pulse rate converter is responsive to the pulse width modulated and amplitude modulated product signal from the multiplier switching circuit means for summing and integrating the multiplier switching circuit means output product signals and converting them into a train of output signal pulses wherein each output signal pulse represents a predetermined quantized amount of electric energy. An automatic offset error correction circuit is responsive to the output from the analog-to-pulse rate converter for automatic addition/substraction averaging of the system offset error signals during each quantizing period of operation of the analog-to-pulse rate converter. The automatic offset error correction circuit comprises polarity reversing switching circuits coupled intermediate the secondary winding of the first transformer and the input to the comparator circuit and at a second output of the multiplier switching circuit with the polarity reversing switching circuits being responsive to the output from the analog-to-pulse rate converter for automatically switching the polarity of the first signals supplied to the comparator and the multiplier switching circuit means midway through the quantizing period of the analog-to-pulse rate converter and for supplying only like polarity product signal pulses from the second output of the multiplier switching circuit means to cause an up-down integration of unlike polarity pulse width modulated/amplitude modulated product signal pulses from the output of the multiplier switching circuit over each quantizing period of operation of the analog-to-pulse rate converter and simultaneously producing a sequential addition/subtraction of like polarity offset error signals over each quantizing period of operation to thereby cancel out the offset error signals automatically. The improved combined watthour and watt meter is completed by a low pass filter circuit coupled through the polarity reversing switching circuit to a second output from the multiplier switching circuit for integrating only like polarity pulse width modulated and amplitude modulated product signal pulses and deriving an output signal indicative of the instantaneous watts being supplied by the source of electric energy at any given time. In preferred embodiments of the invention, watthour indicators are coupled to the output from the analog-to-pulse rate converter for deriving an output indication of the watthours of energy being supplied by the source of electric energy and a watt meter indicator is coupled to the output of the low pass filter circuit for providing an indication of the total watts of energy being supplied by the source.

The invention also makes available improved polyphase combined electronic watthour and watt meters having both analog and digital outputs together with automatic error correction wherein each phase of the poly-phase meter is comprised by first and second transformers and multiplier circuits constructed and interconnected as set forth above and supplied from a sampling signal generator common to all the phases. An analog-to-pulse rate converter constructed as set forth above is common to all of the phases and has its input individually connected through respective summing resistors to the output of the respective multiplier circuit means for each phase. Each of the phases includes automatic offset error correction circuits as described above which are commonly controlled in response to the output from the common analog-to-pulse rate converter. A common low pass filter circuit constructed and interconnected as set forth in the preceeding paragraph has its input respectively connected to second outputs of the respective multiplier switching circuit of each phase via individual summing resistors.

BRIEF DESCRIPTION OF DRAWINGS

Other objects, features and many of the attendant advantages of this invention will become better understood upon a reading of the following detailed description of the drawings wherein like parts in each of the several figures are identified by the same reference character, and wherein.

DETAILED DESCRIPTION OF BEST MODE OF PRACTICING INVENTION

Figure 1:
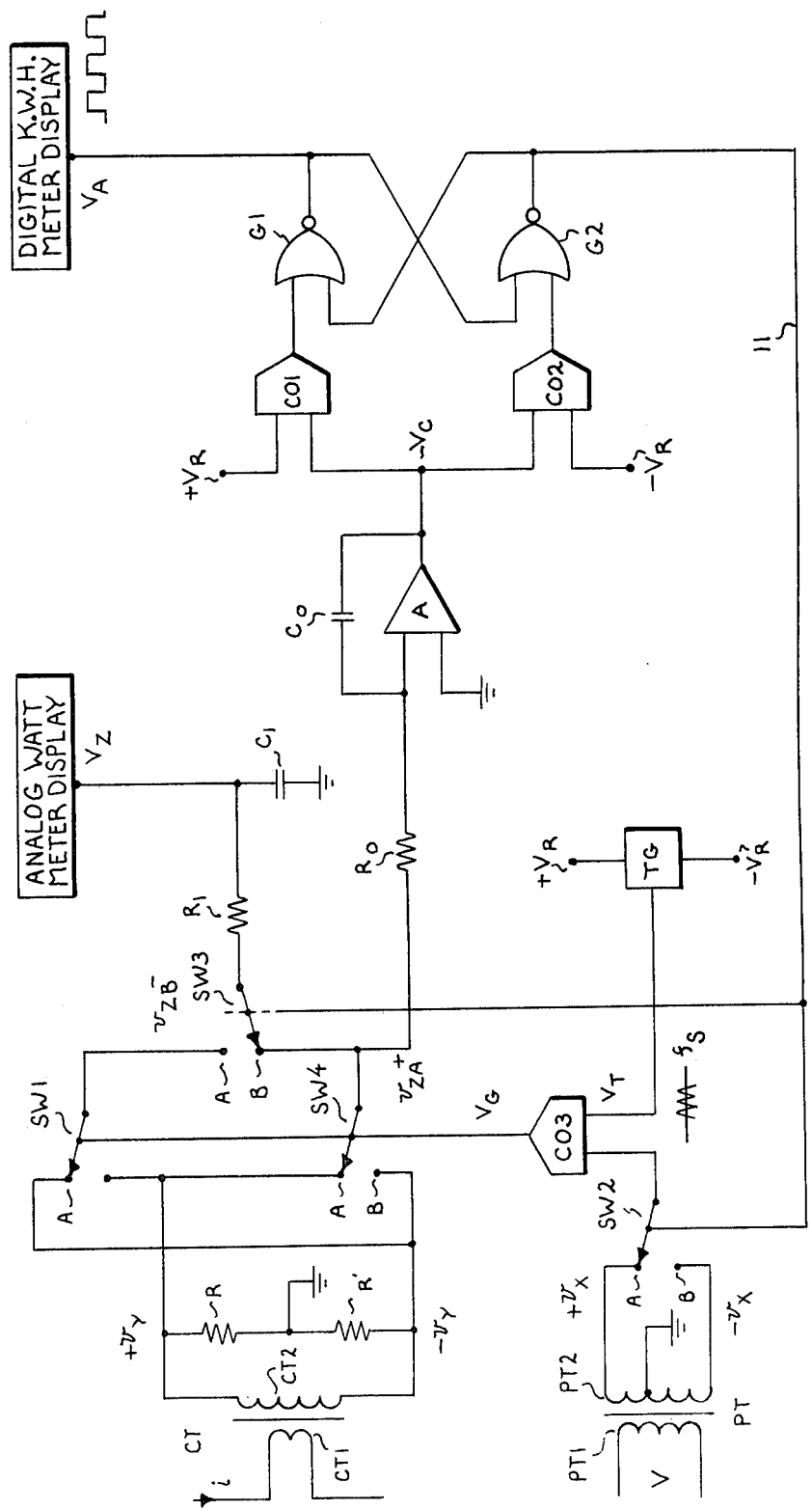
FIG. 1 is a schematic circuit diagram of an improved electronic watt and watthour meter having analog and digital outputs with automatic error correction, constructed according to the invention.

FIG. 1 is a schematic electrical circuit diagram of one form of solid state watt/watthour meter with analog and digital outputs and automatic error correction, constructed according to the invention. In FIG. 1 first transformer means are provided by a voltage transformer PT having a primary winding PT1 supplied from a source of electric energy and excited by the voltage V available from the source. A secondary winding PT2 is inductively coupled to the primary winding and has its center tap grounded with the opposite ends thereof identified by the potentials $+V_X$ and $-V_X$ connected to the fixed contacts of a switch SW2. Switch SW2 which preferably comprises a solid state electronic switch of the type described in U.S. Pat. No. 3,947,763, has its moveable contact connected as one input to a comparator circuit CO3 of conventional construction. Comparator CO3 has supplied to a remaining input terminal thereof a triangular wave-shaped sampling signal $V_T$ having a sampling frequency $f_S$ and supplied from a triangular wave-shaped generator $T_G$. The sampling signal $V_T$ has a frequency $f_S$ which is much greater than that of the frequency of the supply line voltage V applied to the primary winding of voltage transformer PT. As described more fully in the above-referenced U.S. Pat. No. 3,947,763, the disclosure of which is hereby incorporated in its entirety into the disclosure of this application, comparator CO3 develops at its output a pulse width modulated switching signal VG which is applied to the input switching terminals of solid state switches SW1 and SW4. Switches SW1 and SW4 under the control of comparator CO3 constitute a multiplier circuit means for receiving and multiplying current and voltage signals together and deriving an output product signal representative of the instantaneous power being supplied by a source of electric energy being monitored. For this purpose, switches SW1 and SW4 each have two sets of fixed input contacts and an output derived from the moveable contact. Again switches SW1 and SW4 constitute solid state switching circuits of the type disclosed in the above-referenced U.S. Pat. No. 3,947,763. The multiplier switches SW1 and SW4 each have two sets of fixed input contacts A and B with the fixed contact A of SW1 and fixed contact B of SW4 being connected to the lower end of the secondary winding CT2 of a current transformer CT whose primary winding is supplied with a current I representative of the current being supplied from the source of electric energy being monitored. The upper end of the secondary winding CT2 of current transformer CT is connected in common to the fixed contact B of switch SW1 and A of switch SW4. By this arrangement the polarity of the multiplier output signal may be reversed midway between the quantizing period of the circuit as explained hereinafter. A set of series connected, matched fixed resistors R and R' are connected across the secondary winding of current transformer CT with their mid-point being connected to ground.

As explained more fully in the above-referenced U.S. Pat. No. 3,947,763, the output from the multiplier circuit means comprised by comparator CO3 and multiplier switching circuit SW4 appears as a combined pulse-width modulated and amplitude modulated product signal $v_{ZA+}$ at the output of multiplier switch SW4 and is supplied to an integrator circuit comprised by fixed resistor $R_O$, operational amplifier A and feedback capacitor $C_O$. The integrator A, $C_O$, $R_O$ integrates the sampled product signal $v_{ZA+}$ down until its output $V_C$ reaches the reference voltage $-V_R$ applied to one of the input terminals of a comparator CO2 which in conjunction with comparator CO1 and NAND circuits $G_1$ and $G_2$ constitutes a flip-flop which reverses the polarity of its output upon $V_C$ reaching the value $-V_R$. The output of flip-flop CO1, CO2, G1, G2 is a digital output signal $V_A$ which is supplied back through a conductor 11 to control the polarity of switches SW2 and SW3 and hence the polarity setting of the multiplier switches SW1 and SW4 which are turned on and off at the sampling frequency rate $f_S$ of the triangular wave-shaped sampling voltage $V_T$. Thus each time the flip-flop is reset, the polarity of $V_A$ is reversed and since switch SW2 is controlled by $V_A$, the polarity of the first voltage signal $V_Z$ is reversed thus reversing the polarity of the output signal $v_{ZA}$ so that it becomes $v_{ZA}$ minus (negative) and the integrator circuit RO, A, CO starts to integrate up until its output $V_C$ reaches $+V_R$ to reset the flip-flop and return the circuit to its original stated condition. From this description, it will be appreciated that the integrator RO, A, CO together with the flip-flop constitutes a summing type analog-to-pulse rate converter whose basic function is to sum and to integrate the multiplier output product signals and to convert them into an output pulse train, wherein each output pulse represents a predetermined quantized amount of energy.

To obtain an analog signal proportional to watts, an analog output signal $V_Z$ representative of the total instantaneous watts being supplied by a source of electric energy being monitored, is derived by means of switches SW3, SW1 and SW4 in combination together with a low pass filter $R_1$ and $C_1$. During the time interval of the quantizing period when the output $v_{ZA+}$ is positive, the output signal $V_Z$ is positive. When $V_X$ changes its polarity midway between the quantizing period, $v_{ZA}$ becomes $v_{ZA-}$ (negative) and $v_{ZB}$ becomes $v_{ZB+}$ (positive). Concurrently with this switch in polarity, the switch settings of SW3, SW1 and SW4 reverse their polarities from the ones shown in FIG. 1. Hence, switches SW1 and SW3 will combine to provide $v_{ZB+}$ to the low pass filter R1, C1 so that the analog output signal $V_Z$ always remains positive and is proportional to $VI \cos \theta$ where V is the line voltage and I is the line current being monitored and the angle $\theta$ represents the load impedance phase angle. If desired, the analog output signal $V_Z$ can be made negative by reversing the settings of switch SW3 initially.

Automatic offset error correction is provided by feeding back from the output of the analog-to-pulse rate converter $V_A$ over a feedback conductor 11 to control polarity switching of the switches SW2 and SW3. As noted above, upon the output from the integrator A, CO, RO voltage $V_C$ reaching the reference voltage $-V_R$, the flip-flop changes state and causes the switches SW2 and SW3 to be switched from the connections shown in solid line where they are closed on contacts SW2-A and SW3-B, respectively, to their reverse setting whereby they will become closed on SW2-B and SW3-A, respectively. This results in reversing the polarity of $V_X$ which in turn causes the multiplier switches SW1 and SW4 to reverse their setting from the solid line positions shown and to become closed on SW1-B and SW4-B, respectively. This results in applying the voltage $+V_Y$ through SW1-B and SW3-A so that the analog voltage $V_Z$ supplied at the output of the low pass filter R1C1 always remains positive. The multiplier switch output pulse-width-modulated and amplitude modulated product signal $V_{ZA}$ becomes negative however since switch SW4 is closed on contact B during the remaining interval of the quantizing period. Automatic offset error correction is accomplished by the up/down integration averaging operation on a system wide basis. The integrator A, $R_O$, $C_O$ in the analog-to-pulse rate converter integrates up pulses from the outputs of the multiplier switches during about half the time interval of the quantizing period while adding the total offset error signal. Upon the flip-flop switching state thereby reversing the polarity settings of switches SW2 and SW3, the multiplier switches output signal $V_{ZB}$ changes its polarity and the integrator starts to integrate down in the next intervening or remaining time interval of the quantizing period. However, the total offset error signal voltages and currents of the operational amplifiers do not change their polarity when the multiplier switches product output signals are switched in polarity. Consequently, the offset error signal is in fact subtracted during the second half time interval of the quantizing period. Thus the total offset error is corrected out automatically over the complete quantizing period $T_Q = T_U + T_D$. For a more complete description of this automatic offset correction, reference is made to the above-noted article appearing in the International Journal of Electronics, 1980, Vol. 48, No. 3, pages 257-269, the disclosure of which is hereby incorporated into this disclosure in its entirety.

Figure 2:
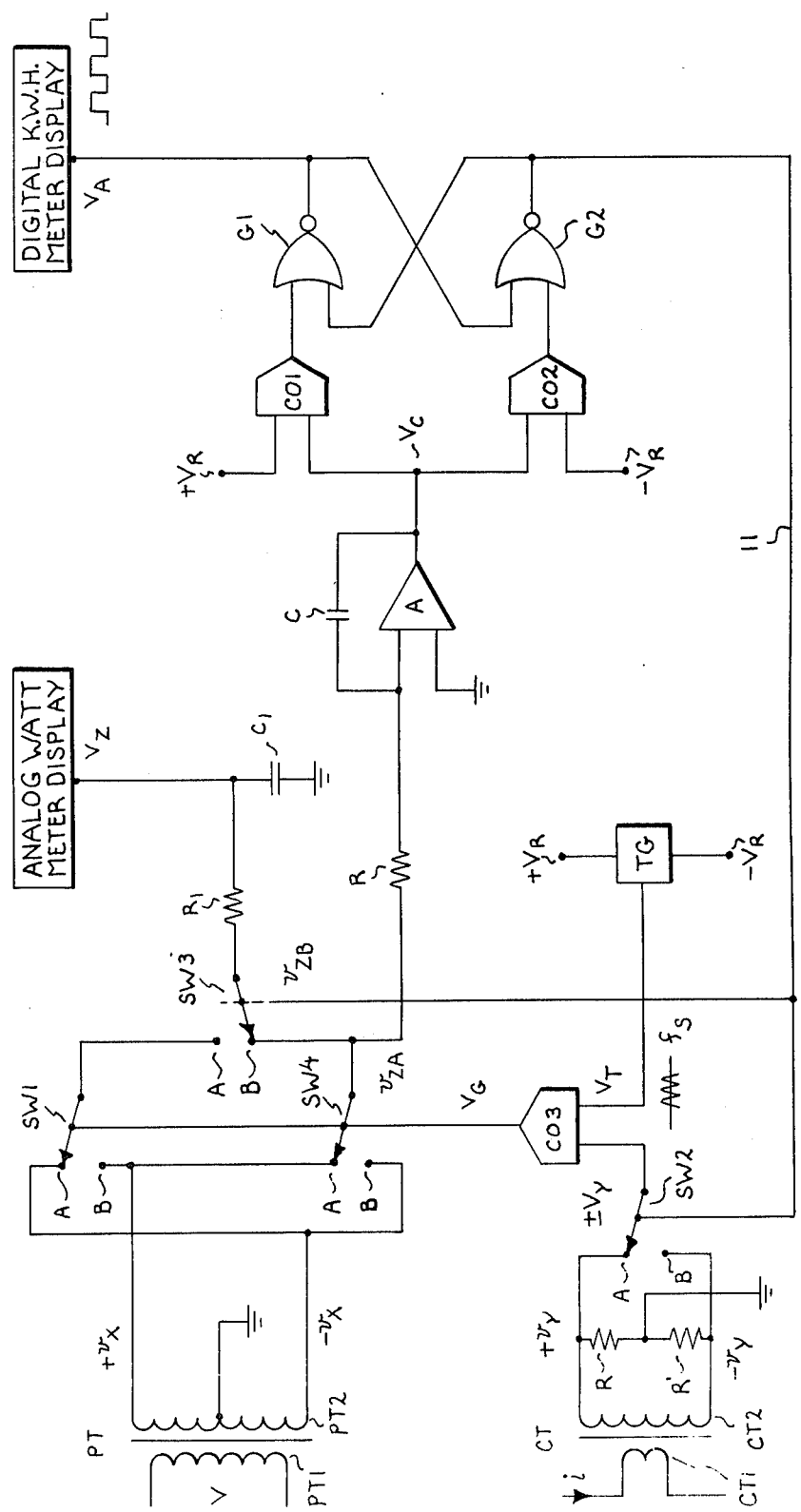
FIG. 2 is a schematic electric circuit diagram of a variation of the circuit shown in FIG. 1 wherein the voltage and current inputs to the circuit are interchanged.

FIG. 2 is a schematic electrical circuit diagram of a solid state semiconductor electronic watt and watthour meter having analog and digital outputs together with automatic error correction which operates in a similar fashion to the FIG. 1 circuit with the notable exception that the current and voltage input signals through the respective voltage transformer PT and current transformer CT are interchanged whereby the first current proportional signal provides pulse-width modulation to the output from comparator CO3 and the voltage proportional second signal provides amplitude modulation to the output amplitude modulated and pulse-width modulated product signal $v_{ZA}$. In all other respects, the circuit operates in identical fashion to the circuit of FIG. 1 and hence will not be described in further detail.

Figure 3:
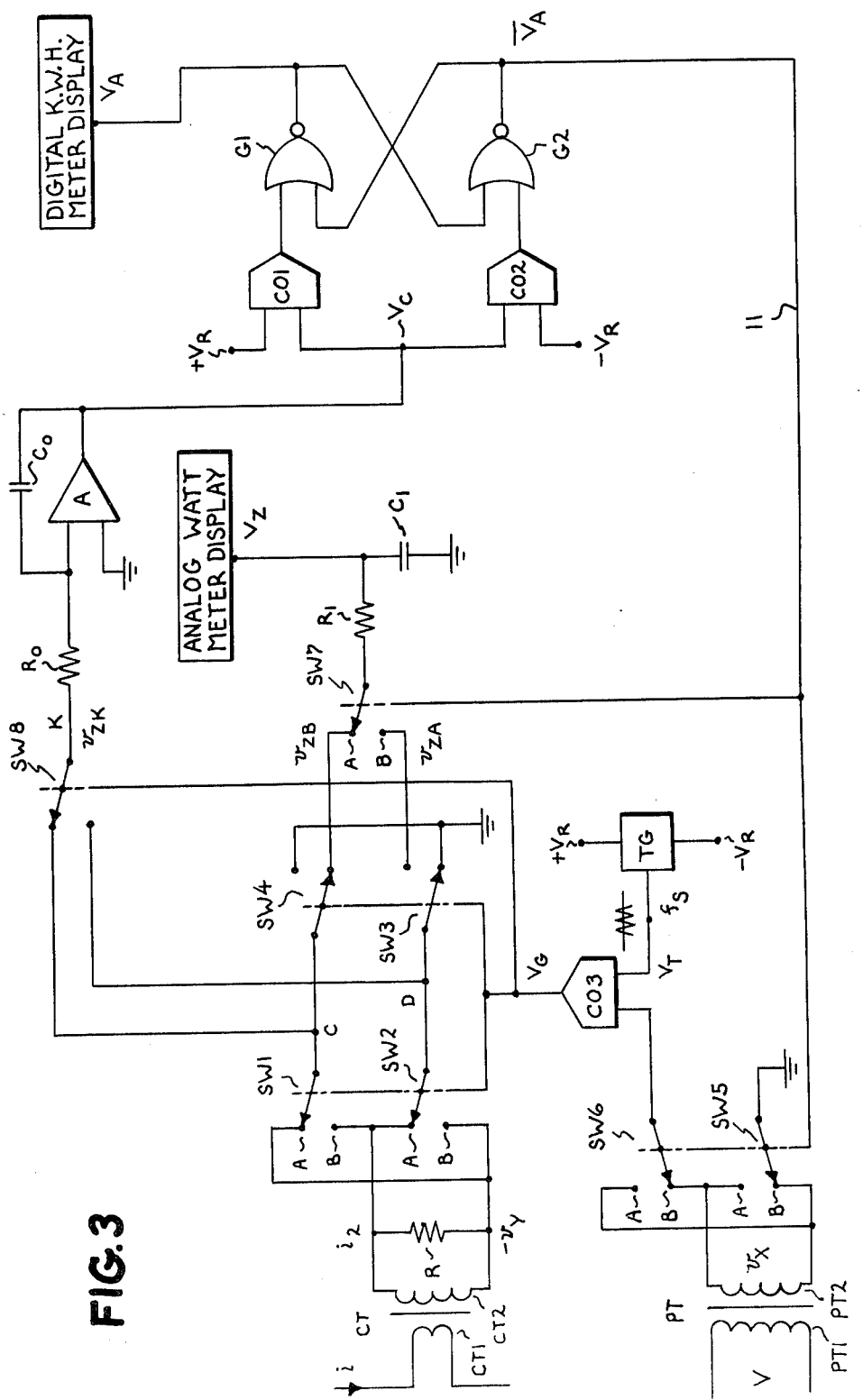
FIG. 3 is a schematic electric circuit diagram of an improved electronic watt and watthour metering circuit according to the invention which employs a single polarity current transformer and voltage transformer and provides both analog and digital outputs together with automatic error correction.

FIG. 3 is a schematic electrical circuit diagram of a combined electronic watt and watthour solid state semiconductor meter circuit according to the invention which uses a single polarity current transformer and voltage transformer for input purposes. The advantage of the circuit of FIG. 3 is that it does away with the need for a center tapped secondary winding in the input transformer or for the inclusion of matched center tapped resistors across the secondary winding of the current transformer with a consequent savings in the ability to use lower cost components, etc. as described more fully in the above-referenced U.S. Pat. No. 3,955,138. This savings in cost is achieved with an increase in the number of switching circuits required from four to eight as illustrated in FIG. 3. In FIG. 3, like components have been given the same reference numerals or letters which were employed with the corresponding components in the circuits of FIGS. 1 and 2.

The FIG. 3 circuit operates in the following manner. The voltage $V_Y$ appears across the fixed resistor R with the indicated instantaneous polarities shown. With the switches set in the manner shown in the drawings, point D and the upper end of the resistor R are maintained at ground potential. Consequently point C is at the potential $-V_Y$ and $V_{ZB}$ on contact A of switch SW7 is negative as is voltage $V_Z$ appearing across low pass filter capacitor C1. It should be noted at this point that the switches SW1 through SW4 and switch SW8 are switching on and off at the sampling frequency so that the voltage $V_{ZB}$ is intermittent but maintains the same polarity. Consequently, voltage $V_{ZK}$ supplied across SW8 does not change its polarity since SW8 and SW1-SW4 are controlled by the output voltage $v_G$ supplied from the output of the comparator CO3.

With the switches SW1-SW8 set as shown in solid line in FIG. 3, the integrator RO, A, CO will integrate up until its output voltage $V_C$ reaches $+VR$. At this moment, the flip-flop CO1, CO2, $G_1$, $G_2$ switches state and reverses the polarity of $\overline{V}_A$. This results in switching SW5, SW6 and SW7 to the opposite polarity with their switchable contacts closed on fixed contacts B. This results in changing the polarity of $v_X$ and thus the polarity of the output control voltage $v_G$ which results in changing the polarities of $v_{ZA}$, $v_{ZB}$ and $v_{ZK}$ during the remaining half interval of the quantizing period. Consequently, capacitor C1 again is charged intermittently to the negative value $V_Z$. Since $v_{ZK}$ has changed its polarity, the integrator RO, A, CO will commence to integrate down until it reaches the value $-V_R$ where it will again cause the flip-flop to change state. At this point, the summing analog-to-pulse rate converter comprised by the integrator and the flip-flop again reverses the polarity of voltage $\overline{V}_A$ and thus returns switches SW5, SW6 and SW7 to their originally set polarity. It will be appreciated therefore that the circuit operates similarly to the circuit described with relation to FIGS. 1 and 2 with the obvious advantage that only single polarities of $v_Y$ and $v_X$ input signals are needed which simplifies the current transformer and the voltage transformer and reduces their cost. Additionally, the power dissipation in the fixed resistor R across the current transformer secondary winding is reduced considerably.

Figure 4:
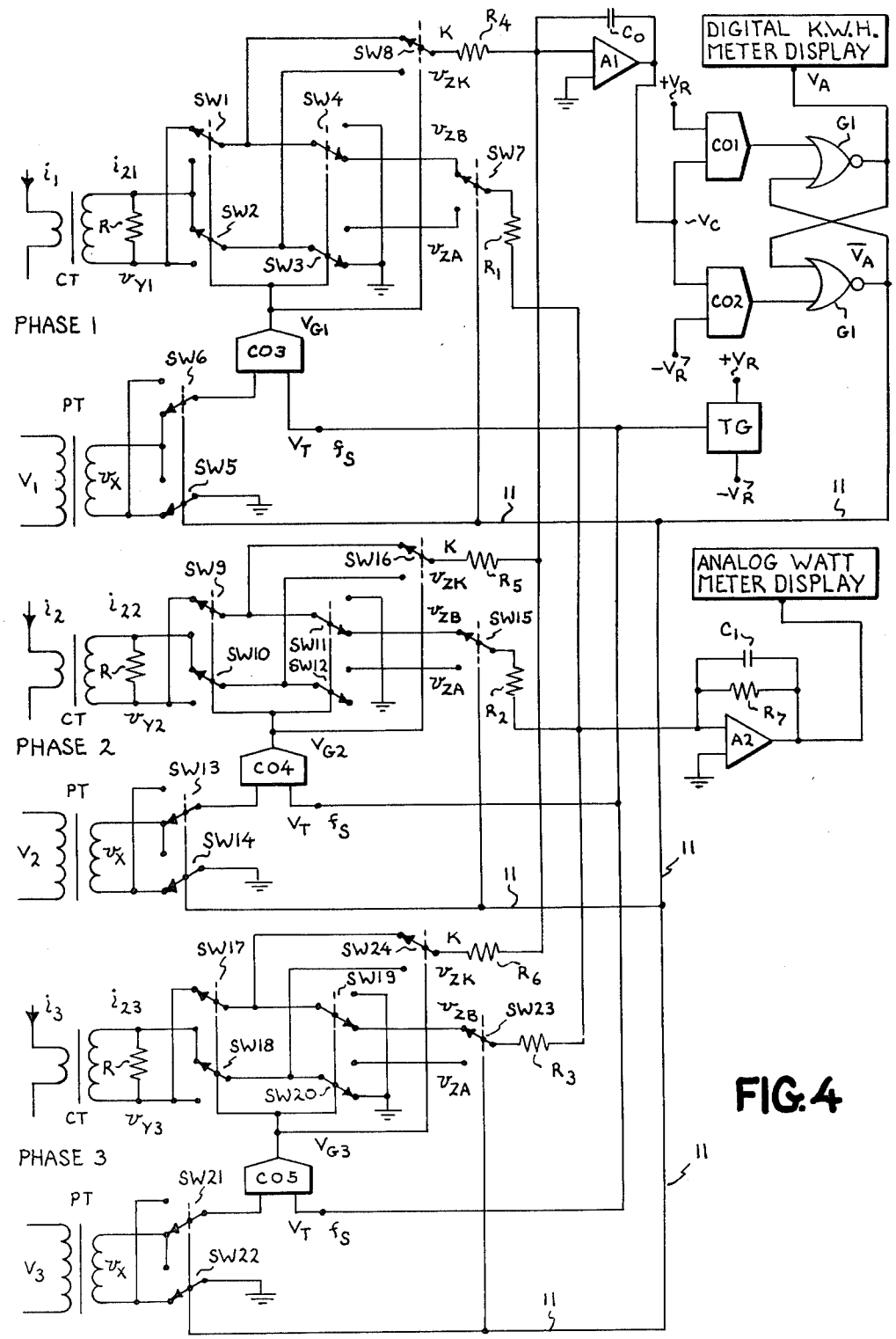
FIG. 4 is a schematic electrical circuit diagram of a poly-phase electronic watt and watthour meter according to the invention and wherein the single polarity current transformer circuit configuration of FIG. 3 is employed.

FIG. 4 is a schematic circuit diagram of a poly-phase electronic solid state semiconductor watt and watthour meter circuit constructed according to the invention and which employs the basic circuit shown in FIG. 3 of the drawings in each of the phases. As described with respect to FIG. 3, each phase includes first and second input transformers for supplying first and second signals proportional to the voltage and current, respectively, for processing by a multiplier circuit means comprised by the comparator and multiplier switching circuits for each phase. These provide at the outputs of the multiplier switching circuits respective pulse-width-modulated and amplitude modulated product signals proportional to watts for supply thru a first output polarity reversing switching circuit to a summing analog-to-pulse rate converter, and for supplying through a second output polarity reversing switching circuit a fixed polarity signal representative of instantaneous watts for supply to a low pass filter that derives an analog output signal proportional to watts. The poly-phase circuit of FIG. 4 utilizes a common triangular waveform signal generator TG which supplies a triangular waveform sampling signal $V_T$ having a sampling frequency $f_S$ to all of the comparators CO3, CO4 and CO5 for each of the phases. A common summing analog-to-pulse rate converter is comprised by an integrator circuit A1, C and flip-flop CO1, CO2, G1, G2 together with the respective summing resistors R4, R5 and R6 which respectively couple the outputs from the multiplying switching circuit of the respective phases to the common summing analog-to-pulse rate converter. Similarly, the summing resistors R1, R2 and R3 serve to couple the respective analog outputs of the different phases to the input of the common low pass filter comprised by operational amplifier A2, R7 and C1.

In operation, the poly-phase circuit of FIG. 4 functions in essentially the same manner as was described with relation to FIG. 3 of the drawings to develop the respective analog output signal representative of watts being supplied to each of the phases across the summing resistors R1, R2 and R3 and supplying the summed signal to the low pass filter comprised by operational amplifier A2, R7 and C1. The combined pulse-width-modulated and amplitude modulated product signals appearing at the outputs of the switching multiplier circuits for each phase similarly are summed in the respective summing resistors R4, R5 and R6 and processed by the summing analog-to-pulse rate converter for developing the digital output signal representative of kilowatt hours of electrical energy being supplied by the source being monitored. Automatic error correction in the manner described with relation to FIGS. 1–3 is obtained by supplying the output from the summing analog-to-pulse rate converter back over the feedback conductors 11 to each of the respective phases.

Figure 5:
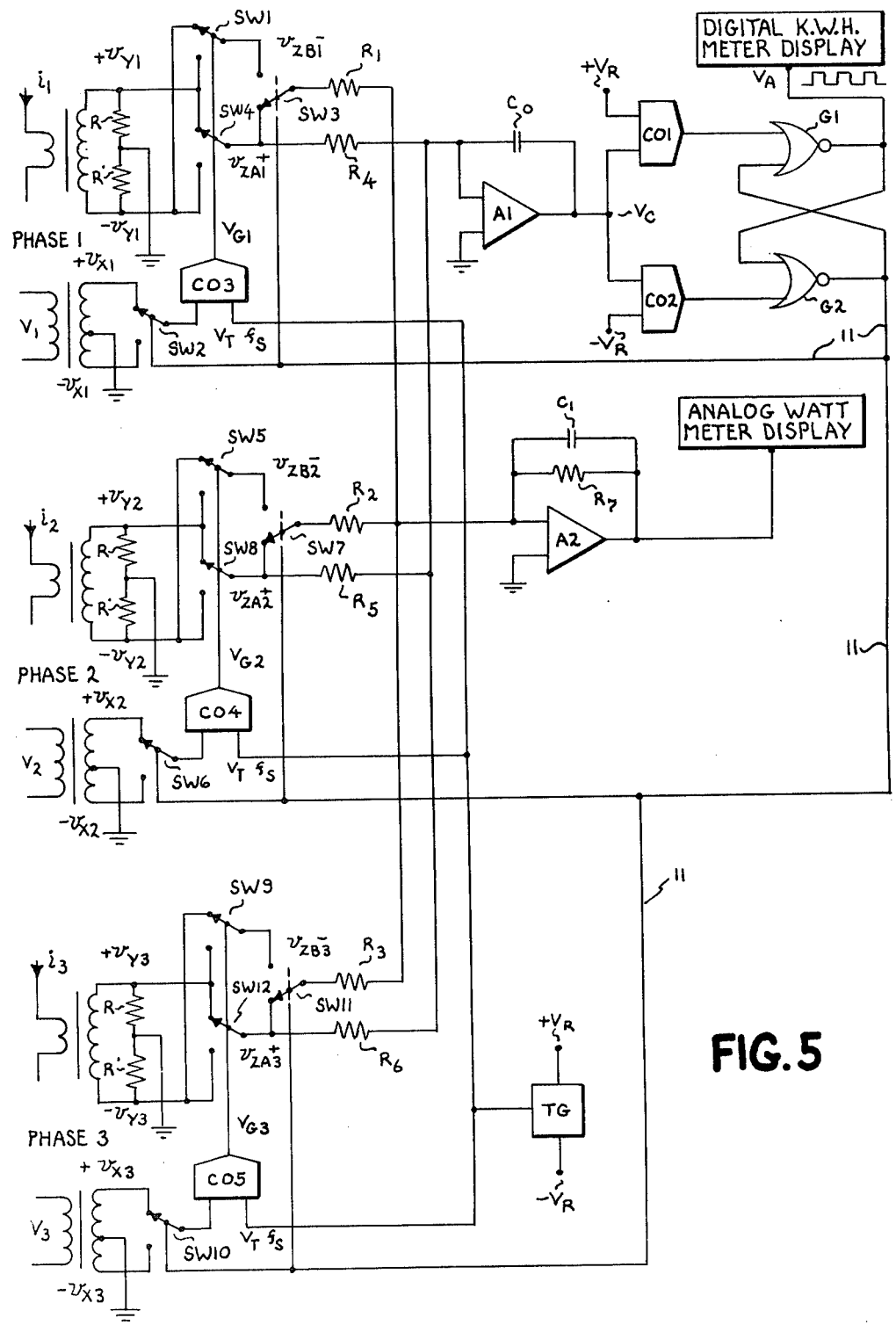
FIG. 5 is a schematic electrical circuit diagram of a poly-phase combined electronic watt and watthour meter according to the invention which employs the single phase configuration of FIG. 1 in each of the phases.

FIG. 5 is a schematic electrical circuit diagram of a poly-phase electronic solid state semiconductor watt and watthour meter according to the invention wherein each of the phases of the poly-phase system employs the metering circuit together with automatic error correction shown and described with relation to FIG. 1. Similar to the polyphase system of FIG. 4, each of the phases has its own individual voltage and current transformers and multiplier circuit means comprised by a comparator and multiplier switching circuit for each phase for developing at the output of the multiplier switching circuits a combined pulse-width-modulated and amplitude modulated product output signal pulse train representative of instantaneous watts. This product signal is supplied over individual summing resistors R4, R5 or R6 to a common summing analog-to-pulse rate converter for all of the phases. An analog output signal representative of total watts being supplied to the poly-phase system is developed by a common low pass filter comprised by an operational amplifier A2, resistor R7 and capacitor C1 supplied through the individual summing resistors R1, R2 and R3 for each of the individual phases. In all other respects, the circuit operates similarly to the circuit operation described with relation to FIG. 1 of the drawings. Here again, it might be noted should one desire, the inputs to the current voltage transformers may be interchanged as was shown and described with relation to FIG. 2; and for that matter interchanges of the input current and voltage transformer can be made in the circuits of FIGS. 3 and 4, should one desire due to the constraints of a particular applicator for which the circuits are being used.

From the foregoing description it will be appreciated that the invention makes available a new and improved electronic solid state semiconductor watt and watthour meter providing both analog and digital outputs in a circuit configuration which also provides automatic offset error correction of offset voltages and currents of operational amplifiers employed in the circuits. The circuits can be embodied in either single phase or poly-phase systems and provide an analog signal proportional to watts for use in demand metering and a digital output signal proportional to kilowatt hours of electrical energy consumed for billing purposes.

INDUSTRIAL APPLICABILITY

This invention relates to electronic solid state semiconductor watt and watthour meters for use in demand metering by electric utilities and for billing out to customers of the utility the total quantities of electrical energy consumed in kilowatt hours.

Having described several embodiments of a new and improved electronic solid state semiconductor combined watthour and watt meter having analog and digital outputs with automatic error correction according to the invention, it is believed that other modifications, variations and changes in the system will be suggested to those skilled in the art in the light of the above teachings. It is therefore to be understood that changes may be made in the particular embodiments of the invention disclosed which are within the full intended scope of the invention as defined by the appended claims.

What is claimed is:

1. An improved electronic combined watthour and watt meter having analog and digital outputs with automatic error correction comprising:

first transformer means having a primary winding connected to a source of electric energy for excitation in response to either the electric current or the electric voltage supplied from the source of electric energy and a secondary winding for providing a first signal proportional thereto;

second transformer means having a primary winding connected for excitation in response to the other of the electric current or electric voltage supplied from the source of electric energy and a secondary winding for providing a second signal proportional thereto;

multiplier circuit means for receiving and multiplying said first and second signals together and deriving an output product signal representative of instantaneous power being supplied by the source of electric energy;

said multiplier circuit means comprising comparator means for receiving said first signal and a sampling signal from a sampling signal source and deriving a pulse width modulated switching signal, and multiplier switching circuit means responsive to and controlled by said pulse width modulated swtiching signal and having the second signal supplied to an input thereof for supplying at its output a pulse width modulated and amplitude modulated product signal of the first and second signals and representative of the instantaneous power being supplied by the source of electric energy;

analog-to-pulse rate converter means responsive to the pulse width modulated and amplitude modulated product signal from said multiplier switching circuit means for summing and integrating the multiplier switching circuit output product signals and converting them into a train of output signal pulses wherein each output signal pulse represents a predetermined quantized amount of electric energy;

automatic offset error correction circuit means responsive to the output from said analog-to-pulse rate converter means for automatic addition/subtraction averaging of system offset error signals during each quantizing period of operation of the analog-to-pulse rate converter means, said automatic offset error correction circuit means comprising polarity reversing switching means coupled intermediate the secondary winding of the first transformer means and the input to said comparator means and at a second output of said multiplier switching circuit means with the polarity reversing switching means being responsive to the output from the analog-to-pulse rate converter means for automaically switching the polarity of the first signals supplied to the comparator and the multiplier switching circuit means midway through the quantizing period of the analog-to-pulse rate converter means and for supplying only like polarity product signal pulses from the second output of the multiplier switching circuit means to cause an up-/down integration of unlike polarity pulse width modulated/amplitude modulated product signal pulses from the output of the multiplier switching circuit means over each quantizing period of operation of the analog-to-pulse rate converter means and simultaneously producing a sequential addition/subtraction of like polarity offset error signals over each quantizing period of operation to thereby cancel out the offset error signals automatically; and low pass filter circuit means coupled through said polarity reversing switching circuit means to the second output from multiplier switching circuit means for integrating only like polarity pulse width modulated and amplitude modulated product signal pulses and deriving an output signal indicative of the total watts being supplied by the source of electric energy.

2. An improved electronic watthour and watt meter according to claim 1 further including watthour indicator means coupled to the output from said analog-to-pulse rate converter means for deriving an output indication of the watthours of energy being supplied by the source of electric energy and wattmeter indicator means coupled to the output from said low pass filter circuit means for deriving an indication of the watts of energy being supplied by the source.

3. An improved combined electronic watthour and watt meter according to claim 1 wherein the transformer means which develops the signal proportional to the current supplied by the source of electric energy has a fixed resistor of predetermined value connected across the secondary winding of the transformer means for developing a voltage signal representative of the current supplied by the source of electric energy.

4. An improved combined electronic watthour and watt meter according to claim 3 wherein the current proportional signal developed across the fixed resistor constitutes the second signal supplied to the input of the multiplier switching circuit means and the multiplier switching circuit means includes an additional set of switching contacts responsive to the output from the comparator means for supplying the product signal at a first output from the multiplier switching circuit means to the input of the analog-to-pulse rate converter means.

5. An improved electronic watthour and watt meter according to claim 4 further including watthour indicator means coupled to the output from said analog-to-pulse rate converter means for deriving an output indication of the watthours of energy being supplied by the source of electric energy and wattmeter indicator means coupled to the output from said low pass filter circuit means for deriving an indication of the watts of energy being supplied by the source.

6. An improved multi-phase electronic combined watthour and watt meter having analog and digital outputs with automatic error correction comprising:

first transformer means for each phase of a multi-phase power supply having a primary winding connected to a respective single phase source of electric energy for excitation in response to either the electric current or the electric voltage supplied from that single phase source of electric energy and a secondary winding for providing a first signal proportional thereto;

second transformer means for each phase of the multi-phase power supply having a primary winding connected for excitation in response to the other of the electric current or electric voltage supplied from the respective single phase source of electric energy and a secondary winding for providing a first signal proportional thereto;

multiplier circuit means for each phase of the multiphase power supply for receiving and multiplying said first and second signals for the respective phase together and deriving an output product signal representative of instantaneous power being supplied by each phase of multi-phase power supply;

each said multiplier circuit means comprising comparator means for receiving said first signal and a sampling signal from a common sampling signal source and deriving a pulse width modulated switching signal, and multiplier switching circuit means responsive to and controlled by said pulse width modulated switching signal, and multiplier switching circuit means responsive to and controlled by said pulse width modulated switching signal and having the second signal supplied to an input thereof for supplying to an output load resistor a pulse width modulated and amplitude modulated product signal of the first and second signals and representative of the instantaneous power being supplied by the respective single phase source of electric energy;

common analog-to-pulse rate converter means having its input coupled to a summing resistor network comprised by the load resistors of all of the phases and responsive to the pulse width modulated and amplitude modulated product signals from said multiplier switching circuit means for all of the phases for summing and integrating the multiplier switching circuit output product signals and converting them into a train of output signal pulses wherein each output signal pulse represents a predetermined quantized amount of electric energy;

common automatic offset error correction circuit means responsive to the output from said common analog-to-pulse rate converter means for automatic addition/subtraction averaging of the system offset error signals during each quantizing period of operation of the common analog-to-pulse rate converter means, said common automatic offset error correction circuit means comprising polarity reversing switching means for each respective phase coupled intermediate the secondary winding of the first transformer means and the input to said comparator means and at a second output of said multiplier switching circuit means with the polarity reversing switching means being responsive to the output from the common analog-to-pulse rate converter means for automatically switching the polarity of the first signals supplied to the comparator and the second output from the multiplier switching circuit means for each respective phase midway through the quantizing period of the analog-to-pulse rate converter means and for supplying only like polarity product signal pulses from the second output of the multiplier switching circuit means to thereby produce an up/down integration of unlike polarity pulse width modulated/amplitude modulated product signal pulses from the output of the multiplier switching circuit means in said first mentioned summing resistor network over each quantizing period of operation of the analog-to-pulse rate converter means and simultaneously producing a sequential addition/subtraction of like polarity offset error signal in said summing resistor network over each quantizing period of operation for cancelling out the system offset error signals automatically;

low pass filter circuit means coupled through a second summing resistor network comprised by respective second load resistors for each phase connected through the polarity reversing switching circuit means at the second output from the respective multiplier switching circuit means for each phase for integrating only like polarity pulse width modulated and amplitude modulated product signal pulses and deriving an output instantaneous signal indicative of the total watts being supplied by the source of electirc energy; and common sampling signal generator means coupled to and supplying the pulse width modulating comparators for all of the phases.

7. An improved electronic watthour and watt meter according to claim 6 further including watthour indicator means coupled to the output from said analog-to-pulse rate converter means for deriving an output indication of the watthours of energy being supplied by the source of electric energy and wattmeter indicator means coupled to the output from said low pass filter circuit means for deriving an indication of the watts of energy being supplied by the source.

8. An improved combined elctronic watthour and watt meter according to claim 6 wherein the transformer means which develops the signal proportional to the current supplied by the source of electric energy has a fixed resistor of predetermined value connected across the seconday winding of the transformer means for developing a voltage signal representative of the curent supplied by the source of electric energy.

9. An improved combined electronic watthour and watt meter according to claim 8 wherein the current proportional signal developed across the fixed resistor constitutes the second signal supplied to the input of the multiplier switching circuit means and the multiplier switching circuit means includes an additional set of switching contacts responsive to the output from the comparator means for supplying the product signal at a first output from the multiplier switching circuit means to the input of the analog-to-pulse rate converter means.

10. An improved electronic watthour and watt meter according to claim 9 further including watthour indicator means coupled to the output from said analog-to-pulse rate converter means for deriving an output indication of the watthours of energy being supplied by the source of electric energy and wattmeter indicator means coupled to the output from said low pass filter circuit means for deriving an indication of the watts of energy being supplied by the source.

* * * * *